United States Patent
Takeuchi

(10) Patent No.: US 8,455,281 B2
(45) Date of Patent: Jun. 4, 2013

(54) OPTICAL SEMICONDUCTOR DEVICE AND METHOD OF MANUFACTURING OPTICAL SEMICONDUCTOR DEVICE

(75) Inventor: Tatsuya Takeuchi, Kanagawa (JP)

(73) Assignee: Sumitomo Electric Device Innovations, Inc., Yokohama-shi, Kanagawa (JP)

(*) Notice: Subject to any disclaimer, the term of this patent is extended or adjusted under 35 U.S.C. 154(b) by 143 days.

(21) Appl. No.: 13/093,267

(22) Filed: Apr. 25, 2011

(65) Prior Publication Data

US 2011/0261848 A1    Oct. 27, 2011

(30) Foreign Application Priority Data

Apr. 27, 2010 (JP) ................. 2010-102725
Mar. 15, 2011 (JP) ................. 2011-057027

(51) Int. Cl.
*H01L 21/00* (2006.01)
*H01S 5/227* (2006.01)

(52) U.S. Cl.
USPC .............. 438/41; 372/45.01; 372/46.01

(58) Field of Classification Search
USPC ......... 438/39, 41, 46, 47; 372/45.01, 46.01; 257/E33.005, E33.011
See application file for complete search history.

(56) References Cited

U.S. PATENT DOCUMENTS

| | | | | |
|---|---|---|---|---|
| 5,561,681 A * | 10/1996 | Nishimura | ............... | 372/46.01 |
| 5,656,539 A * | 8/1997 | Motoda et al. | ............... | 438/39 |
| 5,661,741 A * | 8/1997 | Kakimoto | ............... | 372/50.22 |
| 5,692,002 A * | 11/1997 | Mizutani | ............... | 372/46.01 |
| 5,751,754 A * | 5/1998 | Takagi | ............... | 372/46.01 |
| 5,814,534 A * | 9/1998 | Kimura et al. | ............... | 438/46 |
| 6,160,829 A * | 12/2000 | Sawano | ............... | 372/45.01 |
| 6,437,372 B1 * | 8/2002 | Geva et al. | ............... | 257/94 |
| 6,512,783 B1 * | 1/2003 | Yamamoto et al. | ............... | 372/45.01 |
| 6,556,605 B1 * | 4/2003 | Shtengel et al. | ............... | 372/46.01 |
| 6,563,850 B1 * | 5/2003 | Matsumoto et al. | ............... | 372/45.01 |
| 6,603,785 B2 * | 8/2003 | Yoshida et al. | ............... | 372/45.01 |
| 6,697,407 B2 * | 2/2004 | Nagashima et al. | ............... | 372/46.01 |
| 6,717,187 B2 * | 4/2004 | Kondo et al. | ............... | 257/183 |
| 6,724,068 B2 * | 4/2004 | Matsuyama | ............... | 257/618 |
| 6,775,310 B2 * | 8/2004 | Sai et al. | ............... | 372/45.01 |
| 6,819,695 B1 * | 11/2004 | Akulova et al. | ............... | 372/45.01 |
| 6,853,015 B2 * | 2/2005 | Tsuchiya | ............... | 257/185 |
| 7,006,545 B2 * | 2/2006 | Yoshida et al. | ............... | 372/46.01 |
| 7,008,805 B2 * | 3/2006 | Ketelsen et al. | ............... | 438/22 |

(Continued)

FOREIGN PATENT DOCUMENTS

| | | | |
|---|---|---|---|
| JP | 2000-91702 | * | 3/2000 |
| JP | 2005-209909 | * | 8/2005 |

(Continued)

*Primary Examiner* — Mary Wilczewski
(74) *Attorney, Agent, or Firm* — Westerman, Hattori, Daniels & Adrian, LLP

(57) ABSTRACT

A method of manufacturing an optical semiconductor device includes: forming a mesa structure having an n-type cladding layer, an active layer and a p-type cladding layer in this order on a substrate; forming a p-type semiconductor layer on a side face of the mesa structure and a plane area located at both sides of the mesa structure, the p-type semiconductor layer having a thickness of 5 nm to 45 nm on the plane area; and forming a current blocking semiconductor layer on the p-type semiconductor layer so as to bury the mesa structure, a product of the thickness of the p-type semiconductor layer and a concentration of p-type impurity of the p-type semiconductor layer on the plane area being $2.5 \times 10^{19}$ nm/cm$^3$ or less.

10 Claims, 6 Drawing Sheets

FIRST EMBODIMENT

U.S. PATENT DOCUMENTS

| | | | |
|---|---|---|---|
| 7,103,082 B2 * | 9/2006 | Sugimoto et al. | 372/50.1 |
| 7,122,846 B2 * | 10/2006 | Kish et al. | 257/96 |
| 7,145,930 B2 * | 12/2006 | Honkawa et al. | 372/46.01 |
| 7,244,964 B2 * | 7/2007 | Hata | 257/87 |
| 7,260,130 B2 * | 8/2007 | Takeuchi et al. | 372/46.01 |
| 7,295,587 B2 * | 11/2007 | Ohgoh | 372/45.01 |
| 7,298,769 B2 * | 11/2007 | Watatani et al. | 372/43.01 |
| 7,301,978 B2 * | 11/2007 | Ohgoh | 372/45.011 |
| 7,449,723 B2 * | 11/2008 | Massa et al. | 257/97 |
| 7,613,217 B2 * | 11/2009 | Katsuyama et al. | 372/43.01 |
| 7,720,123 B2 * | 5/2010 | Takiguchi et al. | 372/46.01 |
| 7,772,023 B2 * | 8/2010 | Hiratsuka | 438/39 |
| 7,860,140 B2 * | 12/2010 | Hashimoto | 372/45.01 |
| 7,897,422 B2 * | 3/2011 | Hiratsuka | 438/41 |
| 8,270,446 B2 * | 9/2012 | Shiota et al. | 372/43.01 |
| 8,385,379 B2 * | 2/2013 | Yoshida et al. | 372/45.011 |
| 2001/0010373 A1 * | 8/2001 | Uchida | 257/94 |
| 2005/0195878 A1 * | 9/2005 | Ohgoh | 372/45.01 |
| 2006/0166386 A1 * | 7/2006 | Yamada et al. | 438/22 |
| 2006/0243992 A1 * | 11/2006 | Ikoma et al. | 257/94 |
| 2008/0240191 A1 | 10/2008 | Takada et al. | |
| 2009/0142869 A1 * | 6/2009 | Hiratsuka | 438/40 |
| 2009/0147814 A1 * | 6/2009 | Hosoi et al. | 372/45.01 |
| 2010/0190283 A1 * | 7/2010 | Katsuyama | 438/39 |
| 2011/0261848 A1 * | 10/2011 | Takeuchi | 372/43.01 |

FOREIGN PATENT DOCUMENTS

| | | | |
|---|---|---|---|
| JP | 2008-244264 A | | 10/2008 |
| JP | 2009-59919 | * | 3/2009 |
| JP | 2011-249767 | * | 12/2011 |

\* cited by examiner

FIRST EMBODIMENT

FIG. 5A    SECOND EMBODIMENT
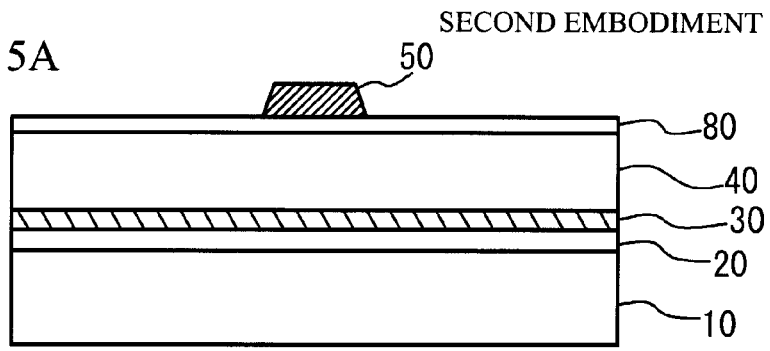
FIG. 5B
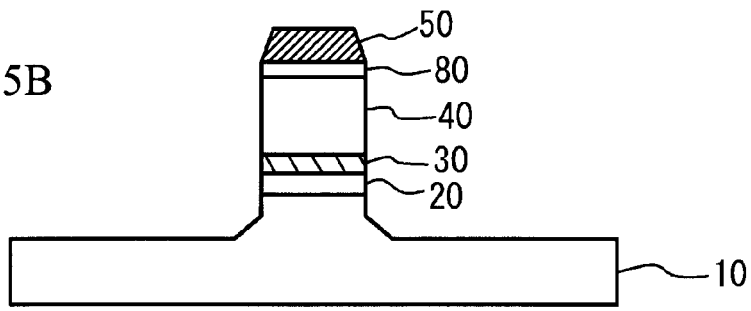
FIG. 5C
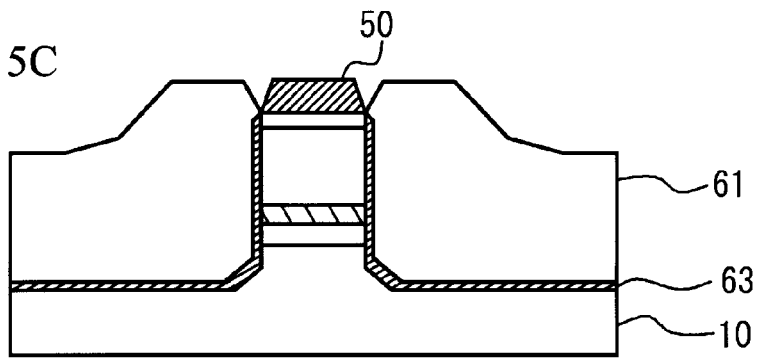
FIG. 5D
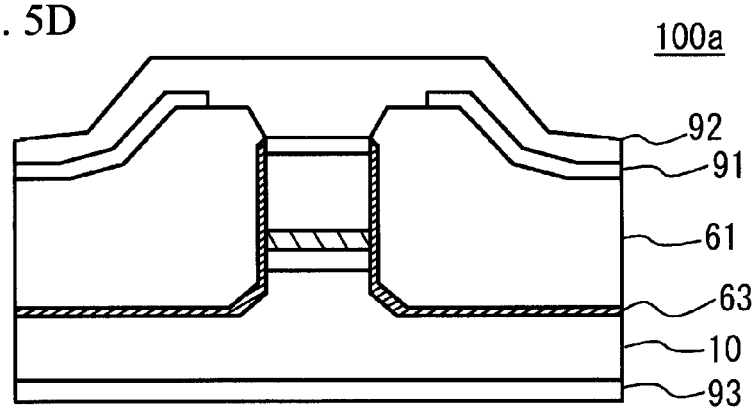

OPTICAL SEMICONDUCTOR DEVICE AND METHOD OF MANUFACTURING OPTICAL SEMICONDUCTOR DEVICE

CROSS-REFERENCE TO RELATED APPLICATION

This application is based upon and claims the benefit of priority of the prior Japanese Patent Application No. 2010-102725 filed on Apr. 27, 2010 and Japanese Patent Application No. 2011-057027 filed on Mar. 15, 2011, the entire contents of which are incorporated herein by reference.

BACKGROUND (i) Technical Field

The present invention relates to an optical semiconductor device and a method of manufacturing the optical semiconductor device.

(ii) Related Art

Japanese Patent Application Publication No. 2008-244264 discloses a semiconductor laser in which a mesa stripe including an active layer is buried with a high resistivity semiconductor layer made of InP including Fe. The semiconductor laser may be manufactured through a process of burying the mesa stripe with the high resistivity semiconductor layer after forming the mesa stripe. In the semiconductor laser, an element capacity is reduced, and frequency band of a direct modulation gets wider.

However, in the semiconductor laser, Fermi level of the high resistivity semiconductor layer is positioned at intermediate of a band gap. Therefore, an electron tends to leak from the active layer to the high resistivity semiconductor layer when the active layer is buried with the high resistivity semiconductor layer. In this case, leak current bypassing the active layer may be increased when providing high current or operating at high temperature. In this case, optical outputting may be restrained.

SUMMARY

It is an object of the present invention to provide an optical semiconductor device having relatively small element capacity and restraining leak current and a method of manufacturing the optical semiconductor device.

According to an aspect of the present invention, there is provided a method of manufacturing an optical semiconductor device including: forming a mesa structure having an n-type cladding layer, an active layer and a p-type cladding layer in this order on a substrate; forming a p-type semiconductor layer on a side face of the mesa structure and a plane area located at both sides of the mesa structure, the p-type semiconductor layer having a thickness of 5 nm to 45 nm on the plane area; and forming a current blocking semiconductor layer on the p-type semiconductor layer so as to bury the mesa structure, a product of the thickness of the p-type semiconductor layer and a concentration of p-type impurity of the p-type semiconductor layer on the plane area being $2.5 \times 10^{19}$ nm/cm$^3$ or less.

According to another aspect of the present invention, there is provided an optical semiconductor device including: a mesa structure having an n-type cladding layer, an active layer and a p-type cladding layer in this order on a substrate; a plane area located on both sides of the mesa structure; a p-type semiconductor layer on a side face of the mesa structure and the plane area, the p-type semiconductor layer having a thickness of 5 nm to 45 nm on the plane area; and a current blocking semiconductor layer on the p-type semiconductor layer so as to bury the mesa structure, a product of the thickness of the p-type semiconductor layer and a concentration of the p-type impurity of the p-type semiconductor layer on the plane area being $2.5 \times 10^{19}$ nm/cm$^3$ or less.

BRIEF DESCRIPTION OF THE DRAWINGS

FIG. 5A through FIG. 5D illustrate a method of manufacturing a semiconductor laser in accordance with a second embodiment.

DETAILED DESCRIPTION

A description will be given of a best mode for carrying the present invention.

Comparative Embodiment

Figure 1:
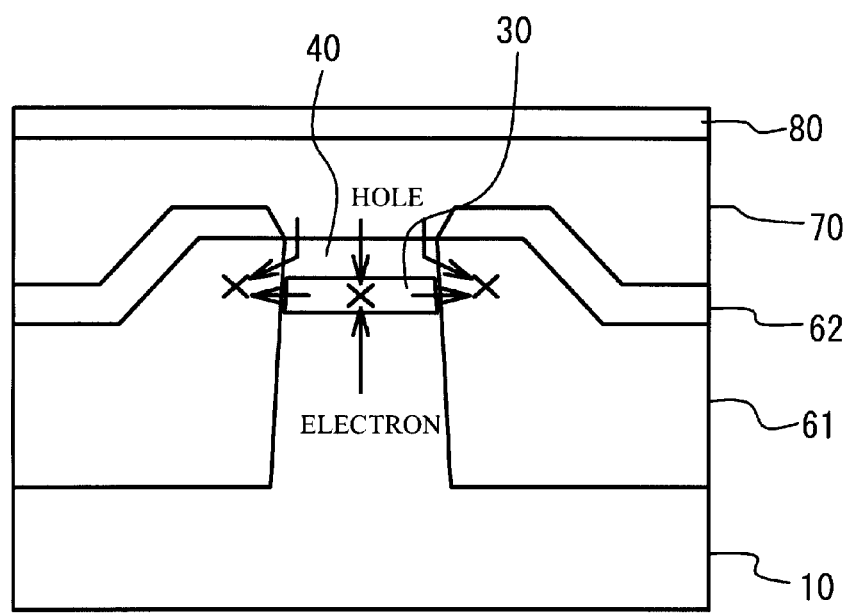
FIG. 1 illustrates a schematic cross sectional view of a semiconductor laser in accordance with a comparative embodiment.

FIG. 1 illustrates a schematic cross sectional view of a semiconductor laser in accordance with a comparative embodiment. In FIG. 1, a hatch is omitted. As illustrated in FIG. 1, the semiconductor laser has a structure in which a mesa stripe formed on an n-type InP substrate 10 is buried with a high resistivity semiconductor layer 61, an n-type InP block layer 62, and a p-type cladding layer 70. The high resistivity semiconductor layer 61 is made of InP in which Fe (iron) is doped.

The mesa stripe has a structure in which an n-type InP cladding layer, an active layer 30 and a p-type cladding layer 40 are provided in this order on the n-type InP substrate 10. The high resistivity semiconductor layer 61 and the n-type InP block layer 62 bury both sides of the mesa stripe. The p-type cladding layer 70 is formed on the mesa stripe and on the n-type InP block layer 62, and thereby buries the mesa stripe. A contact layer 80 is formed on the p-type cladding layer 70.

In the structure, Fermi level of the high resistivity semiconductor layer 61 is positioned at an intermediate of a band gap. Therefore, an electron injected into the active layer 30 tends to leak into the high resistivity semiconductor layer 61. The electron leaking out to the high resistivity semiconductor layer 61 recombines with a hole flowing into the high resistivity semiconductor layer 61 from the p-type cladding layer 70 to form a leak current not contributing to a laser oscillation. In particular, an amount of the leak current caused by an electron leakage from the active layer 30 is increased, when a high current is provided or the semiconductor laser operates at high temperature. This may result in low optical output of the semiconductor laser.

First Embodiment

Figure 2A:
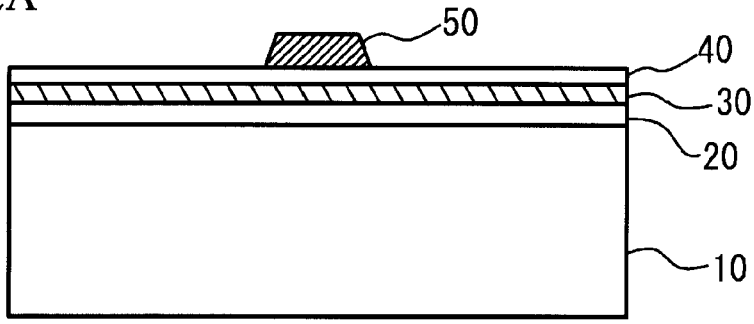
FIG. 2A through FIG. 2D illustrate a method of manufacturing a semiconductor laser in accordance with a first embodiment.

A description will be given of a method of manufacturing a semiconductor laser in accordance with a first embodiment. FIG. 2A through FIG. 3 illustrate the method of manufacturing the semiconductor laser in accordance with the first embodiment. As illustrated in FIG. 2A, an n-type cladding layer 20, the active layer 30 and the p-type cladding layer 40 are grown in this order on a main face of the n-type InP substrate 10. The main face of the n-type InP substrate 10 is (100) plus minus 1 degree face of n-type InP. Next, a mask 50 is formed into a stripe shape on an area of the p-type cladding layer 40 where the mesa stripe extending in [011] direction is to be formed.

The n-type InP substrate 10 is made of n-type InP including n-type impurity of $5.0 \times 10^{17}/cm^3$ to $4.0 \times 10^{19}/cm^3$, and is, for example, made of n-type InP in which Sn (tin) of $1.0 \times 10^{18}/cm^3$ is doped. The n-type cladding layer 20 is, for example, made of n-type InP having a thickness of 0.5 μm in which Si (silicon) of $1.0 \times 10^{18}/cm^3$ is doped. For example, the active layer 30 has a MQW (Multi Quantum Well) structure including a layer made of GaAlInAs. A combination of a well and a barrier composition of the MQW are not limited, in particular. For example, the well and the barrier of the MQW are $Ga_{0.1}Al_{0.2}In_{0.7}As$ and $Ga_{0.15}Al_{0.32}In_{0.53}As$. The p-type cladding layer 40 is, for example, made of p-type InP having a thickness of 0.2 μm in which Zn (zinc) of $1.0 \times 10^{18}/cm^3$ is doped. For example, the mask 50 is made of $SiO_2$ having a thickness of 0.5 μm.

Figure 2B:
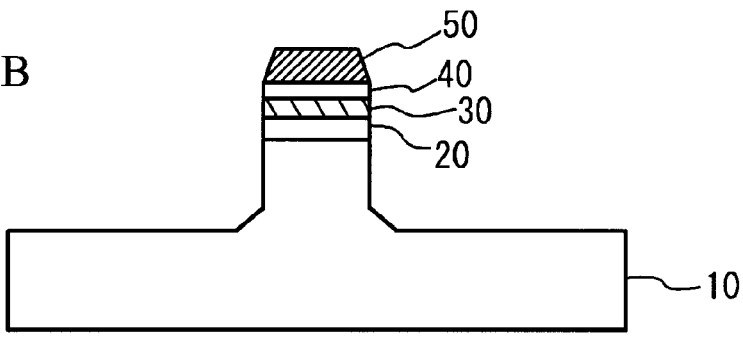
Figure 3:
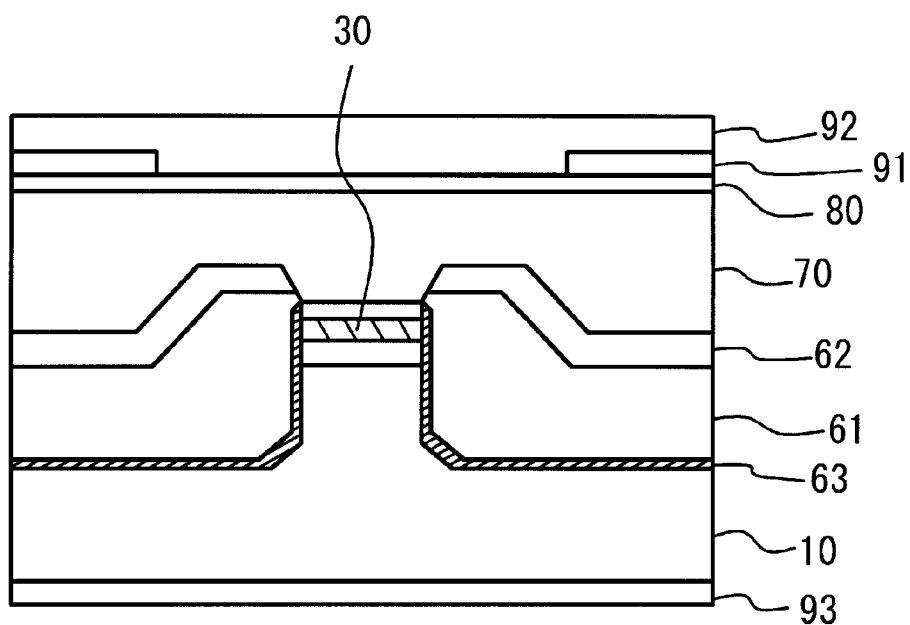
FIG. 3 illustrates the method of manufacturing the semiconductor laser in accordance with the first embodiment.

Next, as illustrated in FIG. 2B, the p-type cladding layer 40, the active layer 30, the n-type cladding layer 20 and a part of the n-type InP substrate 10 are subjected to a dry etching process with use of the mask 50 as an etching mask. Thus, a mesa stripe is formed on the n-type InP substrate 10. RIE (Reactive Ion Etching) method using $SiCl_4$ may be used as the dry etching process. A height of the mesa stripe without the mask 50 is, for example, 1.5 μm to 2.0 μm.

Figure 2C:
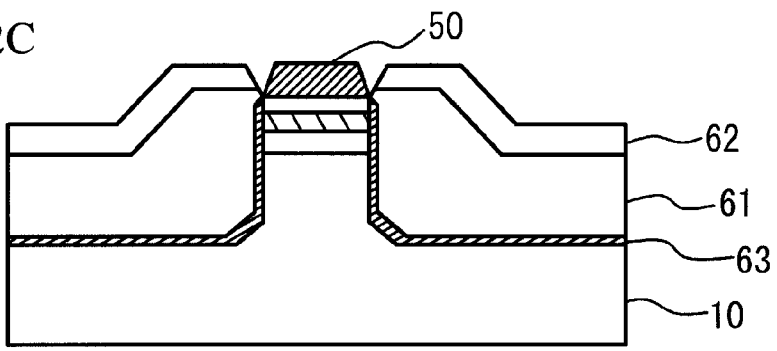

Then, as illustrated in FIG. 2C, a thin p-type semiconductor layer 63 is grown from both sides of the mesa strip to an area of the n-type InP substrate 10 except for the mesa stripe. In this case, the p-type semiconductor layer 63 is grown so that a thickness of the p-type semiconductor layer 63 on the area of the n-type InP substrate 10 except for the mesa stripe is 5 nm to 45 nm. The p-type semiconductor layer 63 is made of p-type semiconductor that is lattice-matched with the n-type InP substrate 10, and is, for example, made of p-type InP in which Zn (zinc) of $4.0 \times 10^{17}/cm^3$ is doped. The p-type semiconductor layer 63 may be made of one of p-type InGaAs, p-type InGaAsP, p-type InAlAs, p-type InAsAsP, p-type InAlGaAs, and p-type InAlGaAsP that are lattice-matched with InP. Mg, Be or the like may be used as a p-type impurity.

Next, the high resistivity semiconductor layer 61 and the n-type InP block layer 62 are grown on the p-type semiconductor layer 63 so that the both sides of the mesa stripe are buried. The high resistivity semiconductor layer 61 is a high resistivity semiconductor layer in which impurity such as Fe, Ti or Co generating deep acceptor level is doped, and acts as a current blocking semiconductor layer. The high resistivity semiconductor layer 61 is, for example, made of InP having a thickness of 1.2 μm in which Fe (iron) of $7.0 \times 10^{16}/cm^3$ is doped. The n-type InP block layer 62 is, for example, made of n-type InP having a thickness of 0.4 μm in which S (sulfur) of $1.0 \times 10^{19}/cm^3$ is doped.

Figure 2D:
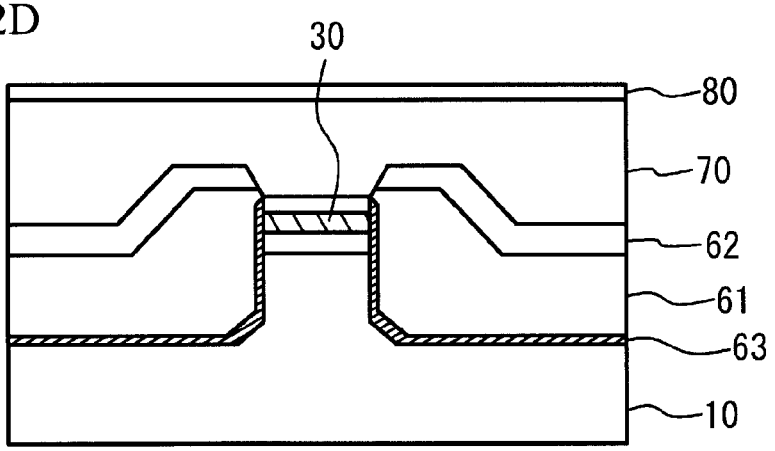

Next, as illustrated in FIG. 2D, the mask 50 is removed with use of HF (hydrofluoric acid) or the like. Then, the p-type cladding layer 70 is grown so as to cover an upper face of the p-type cladding layer 40 and an upper face of the n-type InP block layer 62. The p-type cladding layer 70 is made of p-type semiconductor. For example, the p-type cladding layer 70 is made of the same material as the p-type cladding layer 40. The p-type cladding layer 70 is, for example, made of p-type InP having a thickness of 2.0 μm in which Zn (zinc) of $1.2 \times 10^{18}/cm^3$ is doped. Then, the contact layer 80 is grown on the p-type cladding layer 70. The contact layer 80 is made of a material having a band gap narrower than that of the p-type cladding layer 70. The contact layer 80 is, for example, made of p-type InGaAs having a thickness of 0.5 μm in which Zn (zinc) of $1.2 \times 10^{19}/cm^3$ is doped. The p-type cladding layer 40 acts as a part of the p-type cladding layer 70.

Next, as illustrated in FIG. 3, a passivation layer 91 is formed on the contact layer 80 except for an area above the mesa stripe, and a p-type electrode 92 is formed so as to cover the exposed area of the contact layer 80 and the passivation layer 91. An n-type electrode 93 is formed on a lower face of the n-type InP substrate 10. The passivation layer 91 is made of an insulating material such as $SiO_2$. The p-type electrode 92 is, for example, made of a lamination structure in which Ti, Pt and Au are laminated. The n-type electrode 93 is, for example, made of a lamination structure in which Au, Ge, and Ni are laminated.

With the processes, a semiconductor laser 100 is manufactured. An MOVPE (Metal Organic Vapor Phase Epitaxy) method may be used when growing above-mentioned semiconductor layers. A growth temperature in the MOVPE method may be approximately 600 degrees C. The InP is made from trimethyl indium and phosphine. Dimethyl zinc may be used when doping Zn (zinc). Ferrocene may be used when doping Fe (iron). Hydrogen sulfide may be used when doping S (sulfur). Disilane may be used when doping Si (silicon).

In the embodiment, the thin p-type semiconductor layer 63 is formed on the side faces of the mesa stripe including the side face of the active layer 30. Therefore, the leakage of an electron from the active layer 30 to the high resistivity semiconductor layer 61 is restrained. That is, the leak current is reduced.

The p-type semiconductor layer 63 is formed on the n-type InP substrate 10 when growing the p-type semiconductor layer 63 on the side face of the mesa stripe. In this case, a p-n junction capacity is generated between the p-type semiconductor layer 63 and the n-type InP substrate 10. The p-n junction capacity structures an element capacity of the semiconductor laser 100. The element capacity has an influence on the modulation characteristics when the semiconductor laser 100 modulates a light directly. It is therefore preferable that the element capacity of the semiconductor laser 100 is smaller.

In the embodiment, the p-type semiconductor layer 63 has sufficiently small thickness (5 nm to 45 nm). The thickness is smaller than a width of a depletion layer of the p-n junction extending from an interface between the n-type InP substrate 10 and the p-type semiconductor layer 63 to the burying layers side. Therefore, the depletion layer extending from the p-n junction has an enough large width reaching the high resistivity semiconductor layer 61 through the p-type semiconductor layer 63.

The high resistivity semiconductor layer 61 lacks a carrier therein. That is, the high resistivity semiconductor layer 61 has the same condition as a depletion layer.

Therefore, when the depletion layer reaches the high resistivity semiconductor layer 61, a substantive depletion is seamlessly formed so as to cover the whole area of the p-type semiconductor layer 63 and the high resistivity semiconductor layer 61. Thus, the element capacity of the semiconductor laser 100 is restrained.

In a case where the p-type impurity of the p-type semiconductor layer 63 on the n-type InP substrate 10 is Zn (zinc), the p-n junction capacity is restrained and the depletion layer reaches the high resistivity semiconductor layer 61 sufficiently when a product between an impurity concentration and the thickness of the p-type semiconductor layer 63 is $2.5 \times 10^{19}$ nm/cm$^3$ or less. In a case where the p-type impurity of the p-type semiconductor layer 63 is Zn (zinc), the p-n junction capacity is restrained and the depletion layer reaches the high resistivity semiconductor layer 61 sufficiently when the impurity concentration of the p-type semiconductor layer 63 on the n-type InP substrate 10 is $1.0 \times 10^{17}$/cm$^3$ to $1.5 \times 10^{18}$/cm$^3$.

A width W of a depletion layer extending toward a p-type layer side in a p-n junction is expressed as follows.

$$W = \left\{ \frac{2\varepsilon r \cdot \varepsilon 0 \cdot Nd}{(Na + Nd)} \right\}^{0.5} \cdot (Vd - V)^{0.5}$$

εr: relative permittivity of InP
ε0: permittivity of vacuum
Na: acceptor density
Nd: donor density
Vd: diffusion potential
V: voltage applied to p-n junction It is assumed that Na=$1.0 \times 10^{18}$/cm$^3$, Nd=$2.0 \times 10^{18}$/cm$^3$, and Vd−V=0.6 (V). In this case, W=24 (nm) is obtained. When the thickness of the p-type semiconductor layer 63 is less than 24 (nm), it is estimated that the whole of the p-type semiconductor layer 63 acts as the depletion layer. Actual voltage applied between the substrate 10 and the p-type semiconductor layer 63 is not determined unambiguously because the voltage depends on a burying structure around the active layer. The present inventors have confirmed experimentally that the whole of the p-type semiconductor layer 63 acts as a depletion layer when the product between the thickness and the p-concentration of the p-type semiconductor layer 63 is less than $2.5 \times 10^{19}$ nm/cm$^3$.

In accordance with the embodiment, the leak current is restrained when the p-type semiconductor layer 63 is provided. And, the element capacity generated inevitably when forming the p-type semiconductor layer 63 is reduced, when the thickness of the p-type semiconductor layer 63 is reduced sufficiently. It is preferable that the p-type semiconductor layer 63 has a thickness of 5 nm to 45 nm. It is more preferable that the p-type semiconductor layer 63 has the thickness of 5 nm to 30 nm.

Reduction of the thickness of the p-type semiconductor layer 63 corresponds to reduction of a thickness of an inhibition layer for restraining the leak current. However, it is preferable that the leak current is sufficiently restrained even if the thickness of the inhibition layer is small. Crystallographic orientation dependence of doping efficiency of p-type impurity into a semiconductor crystal may be used.

Figure 4A:
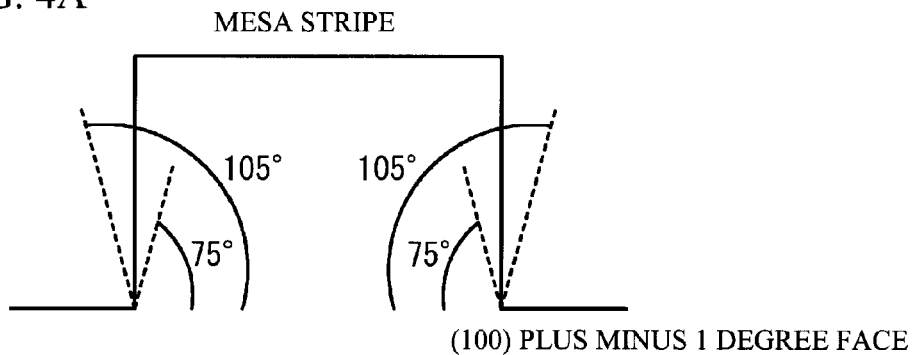
FIG. 4A through FIG. 4C illustrate an angle of a mesa stripe.

In a case where the main face of the n-type InP substrate 10 is (100) plus minus 1 degree face, the doping efficiency of the p-type impurity on the side face of the mesa stripe is twice to eight times as that of the p-type impurity on the main face when the angle of the side face of the mesa stripe is 75 degrees to 105 degrees with respect to the main face as illustrated in FIG. 4A.

Figure 4B:
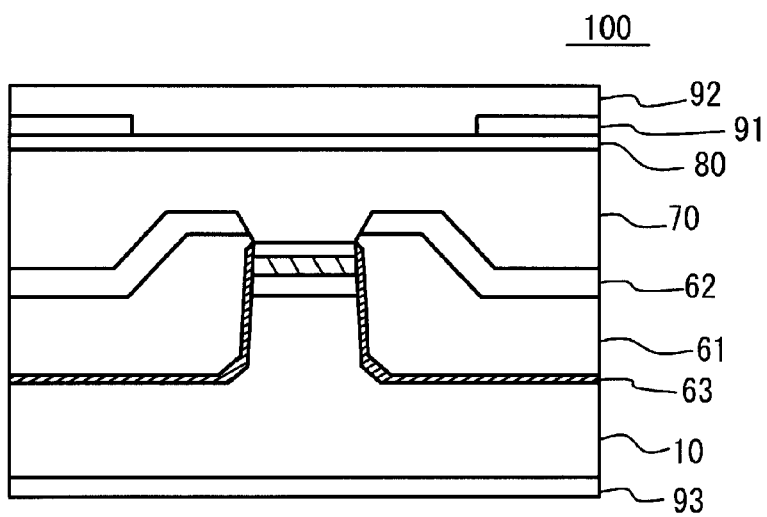
Figure 4C:
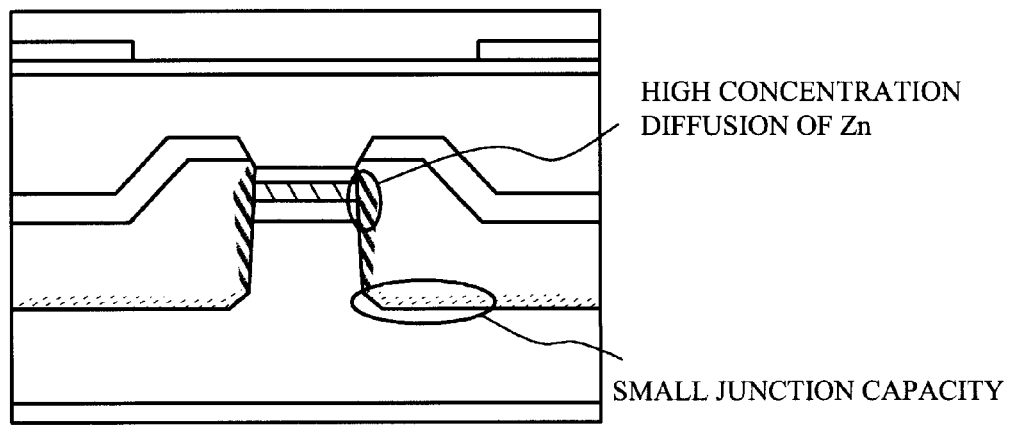

FIG. 4B illustrates the semiconductor laser 100 in a case where the angle of the side face of the mesa stripe is 85 degrees with respect to the n-type InP substrate 10. With the structure, as illustrated in FIG. 4C, the p-type semiconductor layer 63 on the n-type InP substrate 10 acts as a low concentration p-type semiconductor layer, and the p-type semiconductor layer 63 on the side face of the mesa stripe acts as a high concentration p-type semiconductor layer. In this case, the high concentration p-type semiconductor layer is positioned on the side face of the active layer 30. Therefore, the leak current is reduced. Further, the low concentration p-type semiconductor layer is positioned on the main face of the n-type InP substrate 10 generating the p-n junction. Therefore the element capacity is reduced. Accordingly, it is preferable that the angle of the side face of the mesa stripe is 75 to 105 degrees with respect to the main face of the n-type InP substrate 10.

In a case of FIG. 4C, the p-n junction capacity is restrained and the depletion layer sufficiently extends to the high resistivity semiconductor layer 61, when the p-type impurity of the p-type semiconductor layer 63 on the n-type InP substrate 10 is Zn (zinc) and the product between the impurity concentration and the thickness of the p-type semiconductor layer 63 is $2.5 \times 10^{19}$ nm/cm$^3$ or less. And, the p-n junction capacity is restrained and the depletion layer sufficiently extends to the high resistivity semiconductor layer 61, when the p-type impurity is Zn (zinc) and the impurity concentration of the p-type semiconductor layer 63 on the n-type InP substrate 10 is $1.0 \times 10^{17}$/cm$^3$ to $1.5 \times 10^{18}$/cm$^3$.

Second Embodiment

Next, a description will be given of a method of manufacturing a semiconductor laser in accordance with a second embodiment. FIG. 5A through FIG. 5D illustrate the method of manufacturing the semiconductor laser in accordance with the second embodiment. As illustrated in FIG. 5A, the n-type cladding layer 20, the active layer 30, the p-type cladding layer 40 and the contact layer 80 are grown in this order on the main face ((100) plus minus 1 degree) of the n-type InP substrate 10. Next, the mask 50 is formed into a stripe shape on an area of the contact layer 80 where the mesa stripe is to be formed.

The n-type InP substrate 10 is, for example, made of n-type InP in which Sn (tin) of $1.0 \times 10^{18}$/cm$^3$ is doped. The n-type cladding layer 20 is, for example, made of n-type InP having a thickness of 0.5 μm in which Si (silicon) of $1.0 \times 10^{18}$/cm$^3$ is doped. For example, the active layer 30 has a multi quantum well (MQW) structure including a layer made of GaAlInAs. A combination of the well and the barrier composition of the MQW structure are not limited in particular. For example, the MQW has a structure of $Ga_{0.1}Al_{0.2}In_{0.7}As$ (well)/$Ga_{0.15}Al_{0.32}In_{0.53}As$ (barrier). The p-type cladding layer 40 is, for example, made of p-type InP having a thickness of 1.5 μm in which Zn of $1.5 \times 10^{18}$/cm$^3$ is doped. The contact layer 80 is made of a material having a band gap that is narrower than that of the p-type cladding layer 70. For example, the contact layer 80 is made of p-type InGaAs having a thickness of 0.3 μm in which Zn (zinc) of $1.2 \times 10^{19}$/cm$^3$ is doped. For example, the mask 50 is made of $SiO_2$ having a thickness of 0.5 μm.

Next, as illustrated in FIG. 5B, the contact layer 80, the p-type cladding layer 40, the active layer 30, the n-type cladding layer 20, and a part of the n-type InP substrate 10 are subjected to a dry etching process with use of the mask 50 as an etching mask. Thus, a mesa stripe is formed on the n-type InP substrate 10. RIE (Reactive Ion Etching) method using $SiCl_4$ may be used as the dry etching process. A height of the mesa stripe without the mask 50 is, for example, 3.0 μm.

Next, as illustrated in FIG. 5C, the p-type semiconductor layer 63 is grown from the both side faces of the mesa stripe to an area of the n-type InP substrate 10 except for the mesa stripe. The p-type semiconductor layer 63 is, for example, made of p-type InP in which Zn (zinc) of $4.0 \times 10^{17}$/cm$^3$ is doped. The p-type semiconductor layer 63 may be made of one of p-type InGaAs, p-type InGaAsP, p-type InAlAs, p-type InAlAsP, p-type InAlGaAs and p-type InAlGaAsP that are lattice-matched with InP. Mg, Be or the like may be used as a p-type impurity. The p-type semiconductor layer 63 has a thickness of 5 nm to 45 nm.

Next, the high resistivity semiconductor layer 61 is grown on the p-type semiconductor layer 63 so as to bury the both sides of the mesa stripe. The high resistivity semiconductor layer 61 is a semiconductor layer in which impurity such as Fe, Ti or Co generating deep acceptor level is doped. For example, the high resistivity semiconductor layer 61 is made of InP having a thickness of 2.4 μm in which Fe (iron) of $7.0 \times 10^{16}$/cm$^3$ is doped.

Next, as illustrated in FIG. 5D, the mask 50 is removed with use of HF (hydrofluoric acid) or the like. Next, the passivation layer 91 is formed on the upper face of the high resistivity semiconductor layer 61. And, the p-type electrode 92 is formed so as to cover the contact layer 80, an exposed area of the high resistivity semiconductor layer 61, and the passivation layer 91. The n-type electrode 93 is formed on the lower face of the n-type InP substrate 10. The passivation layer 91 is, for example, made of $SiO_2$ having a thickness of 0.3 μm. The p-type electrode 92 is, for example, made of a lamination structure in which Ti, Pt and Au are laminated in this order. The n-type electrode 93 is made of a lamination structure in which Au, Ge and Ni are laminated in this order.

With the processes, a semiconductor laser 100a is manufactured in accordance with the second embodiment. An MOVPE (Metal Organic Vapor Phase Epitaxy) method may be used when growing the above-mentioned semiconductor layers. A growth temperature in the MOVPE method may be approximately 600 degrees C. The InP is made from trimethyl indium and phosphine. Dimethyl zinc may be used when doping Zn (zinc). Ferrocene may be used when doping Fe (iron). Hydrogen sulfide may be used when doping S (sulfur). Disilane may be used when doping Si (silicon).

In the embodiment, the leak current is restrained when the p-type semiconductor layer 63 is provided. And, the element capacity generated inevitably when forming the p-type semiconductor layer 63 is retrained, when the thickness of the p-type semiconductor layer 63 is reduced sufficiently.

In the embodiment, the doping efficiency of the p-type impurity into the p-type semiconductor layer formed on the side face of the mesa stripe may be enlarged, when the angle of the side face of the mesa stripe is 75 degrees to 105 degrees with respect to the main face of the n-type InP substrate 10.

An impurity such as Fe, Ti, or Co generating deep acceptor level may be doped together with the p-type impurity into the p-type semiconductor layer 63, in the above-mentioned embodiments. In this case, diffusion of the p-type impurity from the p-type semiconductor layer 63 to another region is restrained when the impurity such as Fe is doped. The concentration of the impurity such as Fe in the p-type semiconductor layer 63 may be approximately as the same as that in the high resistivity semiconductor layer 61.

In FIG. 2A through FIG. 5D, hatching is omitted except for the active layer 30, the mask 50, and the p-type semiconductor layer 63.

In the above-mentioned embodiments, a semiconductor laser is described as an example of an optical semiconductor device. The optical semiconductor device is not limited to the semiconductor laser. For example, the optical semiconductor device may be another one such as a semiconductor optical amplifier (SOA).

EXAMPLES

Current characteristics were measured with respect to the semiconductor lasers in accordance with the comparative embodiment and the first embodiment.

[Sample 1]
The current characteristics of the semiconductor laser in accordance with the first embodiment was measured as a sample 1. Temperature in the measuring was set to be 85 degrees C. Element length L was set to be 200 μm. The thickness of the p-type semiconductor layer 63 was set to be 25 nm. The product between the thickness of the p-type semiconductor layer 63 on the n-type InP substrate 10 and the concentration of the p-type impurity in the p-type semiconductor layer 63 was set to be $1.25 \times 10^{19}$ nm/cm$^3$.

[Sample 2]
The current characteristics of the semiconductor laser in accordance with the comparative embodiment was measured as a sample 2. The sample 2 was a semiconductor laser manufactured with the same method as the first embodiment except for not forming the p-type semiconductor layer 63. The temperature in the measuring was set to be 85 degrees C. The element length L was set to be 200 μm.

Figure 6:
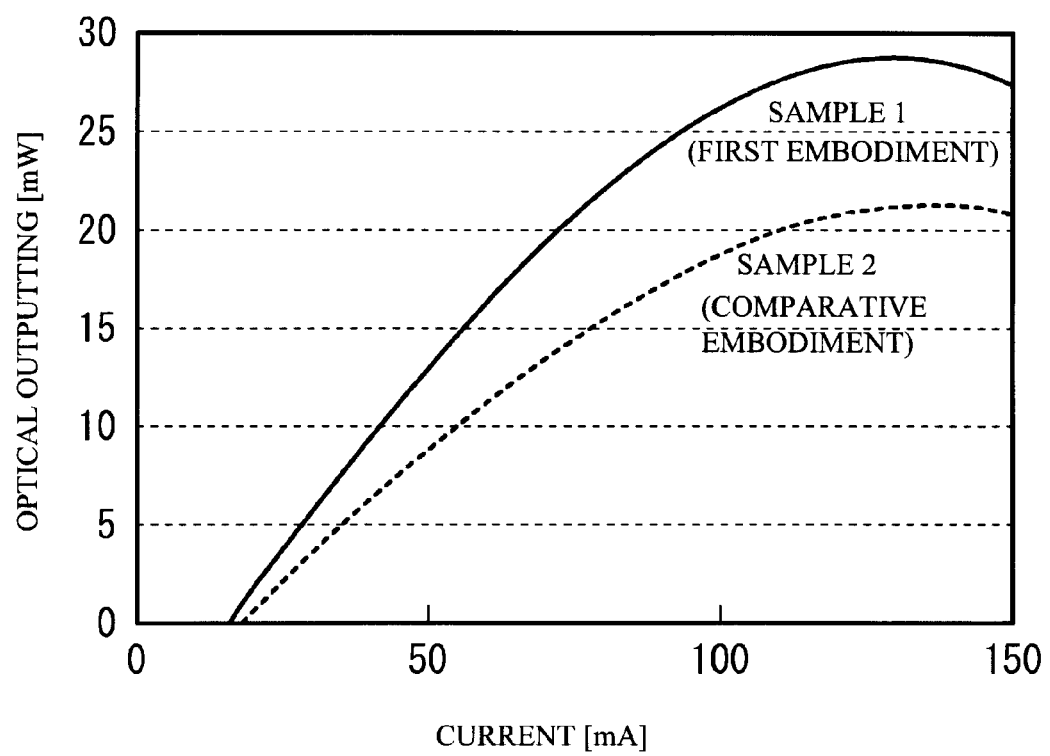
FIG. 6 illustrates current characteristics of samples 1 and 2.

FIG. 6 illustrates the current characteristics of the samples 1 and 2. In FIG. 6, a horizontal axis indicates a current provided to the semiconductor laser, and a vertical axis indicates optical outputting of the semiconductor laser. The optical outputting of the sample 1 was increased by approximately 7 mW at the provided current of approximately 130 mA, compared to the sample 2. It is thought this is because leakage of an electron provided to the active layer 30 into the high resistivity semiconductor layer 61 was restrained. Frequency response band (3 dB-down band) of modulation of the semiconductor laser of the sample 1 was 15 GHz. This value is large one exceeding 10 GHz. This is because the element capacity of the semiconductor laser of the sample 1 was sufficiently small.

The present invention is not limited to the specifically disclosed embodiments and variations but may include other embodiments and variations without departing from the scope of the present invention.

What is claimed is:

1. A method of manufacturing an optical semiconductor device comprising:
    forming a mesa structure having an n-type cladding layer, an active layer and a p-type cladding layer in this order on a substrate;
    forming a p-type semiconductor layer on a side face of the mesa structure and a plane area located at both sides of the mesa structure, the p-type semiconductor layer having a thickness of 5 nm to 45 nm on the plane area; and
    forming a current blocking semiconductor layer on the p-type semiconductor layer so as to bury the mesa structure,
    a product of the thickness of the p-type semiconductor layer and a concentration of p-type impurity of the p-type semiconductor layer on the plane area being $2.5 \times 10^{19}$ nm/cm$^3$ or less.

2. The method as claimed in claim 1, wherein the concentration of the p-type impurity of the p-type semiconductor layer is $1.0 \times 10^{17}$/cm$^3$ to $1.5 \times 10^{18}$/cm$^3$.

3. The method as claimed in claim 1, wherein the p-type impurity of the p-type semiconductor layer is Zn, Mg, or Be.

4. The method as claimed in claim 1, wherein:
    the substrate is made of InP; and
    the p-type semiconductor layer is made of InP or one of InGaAs, InGaAsP, InAlAs, InAlAsP, InAlGaAs and InAlGaAsP that are lattice-matched with InP.

5. The method as claimed in claim 1, wherein:
    a main face of the substrate is (100) plus minus 1 degree face; and
    the mesa structure is formed on the main face.

6. The method as claimed in claim 5, wherein the mesa structure extends in [011] direction.

7. The method as claimed in claim 1, wherein the plane area is made of n-type semiconductor and includes n-type impurity having a concentration of $5.0\times10^{17}/cm^3$ to $4.0\times10^{19}/cm^3$.

8. The method as claimed in claim 5, wherein an angle of the side face of the mesa structure is 75 degrees to 105 degrees with respect to the main face of the substrate.

9. The method as claimed in claim 1, wherein Fe is doped in the p-type semiconductor layer when forming the p-type semiconductor layer.

10. The method as claimed in claim 1, wherein the optical semiconductor device is a semiconductor laser of direct modulation type.

* * * * *